(12) United States Patent
Yamashita (10) Patent No.: US 7,098,614 B2
(45) Date of Patent: Aug. 29, 2006

(54) ELECTROSTATIC ACCELERATOR AND ION IMPLANTING APPARATUS WITH THE SAME

(75) Inventor: Takatoshi Yamashita, Kyoto (JP)

(73) Assignee: Nissin Ion Equipment Co., Ltd., Kyoto (JP)

(*) Notice: Subject to any disclaimer, the term of this patent is extended or adjusted under 35 U.S.C. 154(b) by 0 days.

(21) Appl. No.: 10/357,398

(22) Filed: Feb. 4, 2003

(65) Prior Publication Data

US 2003/0173914 A1    Sep. 18, 2003

(30) Foreign Application Priority Data

Feb. 6, 2002    (JP) ............................. 2002-029392

(51) Int. Cl.
*H01J 23/00* (2006.01)
(52) U.S. Cl. .................................. 315/500; 250/492.21
(58) Field of Classification Search ........ 315/500–507, 315/5.31, 5.32, 5.37, 5.38, 5.39, 5.4, 111.01–111.91, 315/396 R; 250/398, 423 R, 492.2, 492.21, 250/396 R, 394, 492.3, 413 R
See application file for complete search history.

(56) References Cited

U.S. PATENT DOCUMENTS

| | | | |
|---|---|---|---|
| 4,383,180 A | 5/1983 | Turner | 315/500 |
| 4,556,794 A | 12/1985 | Ward et al. | 250/309 |
| 5,187,371 A * | 2/1993 | Matsui et al. | 250/396 R |
| 6,326,631 B1 * | 12/2001 | Politiek et al. | 250/492.21 |
| 6,525,326 B1 * | 2/2003 | Harrington et al. | 250/492.21 |
| 6,734,446 B1 * | 5/2004 | Yamazaki et al. | 250/492.21 |

FOREIGN PATENT DOCUMENTS

| | | |
|---|---|---|
| JP | 60207237 | 10/1985 |
| JP | 63119199 | 5/1988 |
| JP | 05-47344 | 2/1993 |
| JP | 6-68836 | 3/1994 |
| JP | 08-36100 | 2/1996 |
| JP | 09-45273 | 2/1997 |
| WO | WO 02/052609 A2 | 7/2002 |

OTHER PUBLICATIONS

Hideo Kawahara, Japanese Office Action Mailing Date Aug. 31, 2004, and English translation.

* cited by examiner

*Primary Examiner*—Wilson Lee
(74) *Attorney, Agent, or Firm*—Finnegan, Henderson, Farabow, Garrett & Dunner LLP (57) ABSTRACT

This electrostatic acceleration column has first to fifth electrodes arranged in a traveling direction of ions, which are a kind of charged particles. Then, the second electrode divided into two electrode members, which are opposed to each other across a path of the ions, and to which different electric potentials are applied to deflect the ions. Further, the electrodes arranged on a downstream side from the electrode are arranged along an orbit of ions deflected by the electrode and having specific energy.

11 Claims, 3 Drawing Sheets

ELECTROSTATIC ACCELERATOR AND ION IMPLANTING APPARATUS WITH THE SAME

BACKGROUND OF THE INVENTION

1. Field of the Invention

The present invention relates to an electrostatic accelerator (Hereinafter, referred to as "electrostatic acceleration column") for accelerating or decelerating charged particles, and more relates to an ion implanting apparatus provided with the electrostatic acceleration column.

2. Description of the Related Art

One example of an ion implanting apparatus provided with a conventional electrostatic accelerator (Hereinafter, referred to as "electrostatic acceleration column") for accelerating or decelerating ions (positive ions in the following, except where specifically noted), which are a kind of charged particles.

Figure 5:
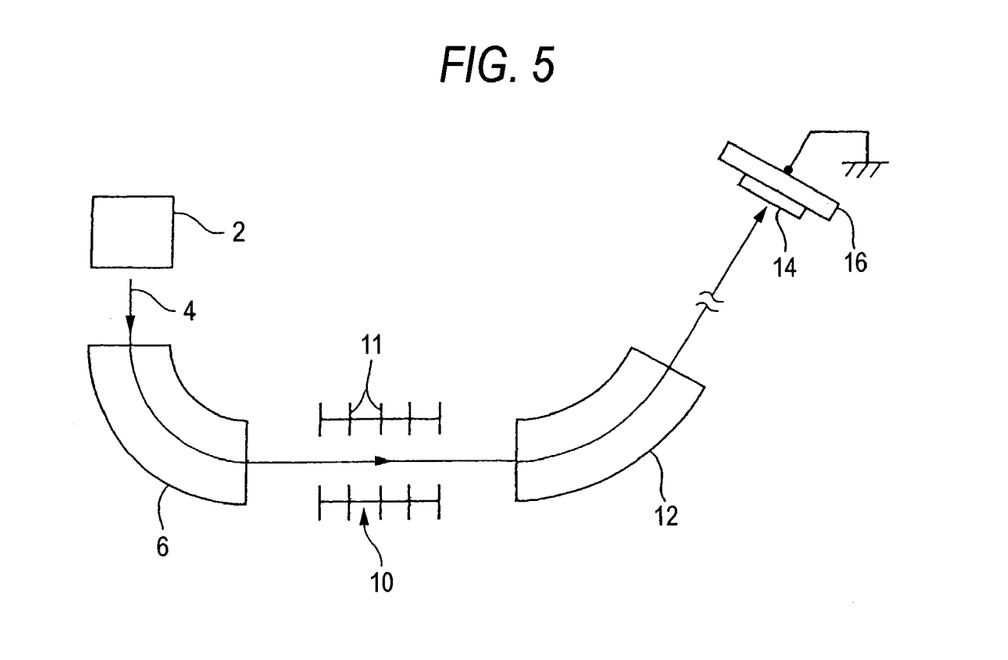
FIG. 5 is a schematic view showing one example of an ion implanting apparatus provided with a conventional electrostatic acceleration column.

This ion implanting apparatus is constructed as follows: ions 4 (to be more specific, an ion beam) are emitted from an ion source 2. A desired kind of ions is selected by a mass separating magnet 6. Then, the ions are accelerated or decelerated by an electrostatic acceleration column 10 to have desired energy. The desired kind of ions 4 having desired energy is implanted into a target (for example, a substrate of a semiconductor wafer or the like) held by a holder 16 to perform ion implantation. The conventional electrostatic acceleration column 10 has a plurality of electrodes 11 arranged in a straight line in the traveling direction of the ions 4.

In this respect, a path of the ions 4 from an exit of the ion source 2 to the holder 16 is received in a vacuum container but the illustration thereof is omitted here. Moreover, there are cases where a scanner for scanning the ions is provided but its illustration is also omitted here. This is the same in FIG. 4.

In the ion implanting apparatus described above, while the ions 4 are traveling, for example, from the exit of the mass separating magnet 6 to the exit of the electrostatic acceleration column 10, the ions 4 emitted from the electrostatic acceleration column 10 are mixed with ions or neutral particles having energy different from desired energy by the phenomenon described below. This kind of mixing phenomenon is called "energy contamination".

(1) Part of the ions 4 are converted into neutral particles by a charge conversion caused when the ions 4 collide with residual gas including ions or neutral particles having energy different from desired energy. The neutral particles are not accelerated or decelerated by the electrostatic acceleration column 10, which is different from the ions 4. Thus, the ions 4 are mixed with the neutral particles having energy different from desired energy.

(2) Part of the ions 4 are changed in valence by the charge conversion caused when the ions 4 collide with the residual gas. When the valences of the ions 4 are changed, the ions 4 accelerated or decelerated by the electrostatic acceleration column 10 become different from each other in energy because voltage applied to the electrostatic acceleration column 10 is constant.

For example, when a divalent ion is changed into a univalent ion, the energy of the ion accelerated by the electrostatic acceleration column 10 becomes one half. In this manner, the ions 4 are mixed with ions having energy different from desired energy.

(3) In a case where the ion 4 is a molecular ion, the ion 4 is changed into an ion different from the original ion by molecular dissociation. For example, a $BF_2$ ion is dissociated into a BF ion and a F ion, or a B ion and a $F_2$ ion. The energy of each ion produced by the molecular dissociation becomes smaller than the energy of the original ion. This is because the sum of these energies is equal to the energy of the original ion. In this manner, the ions 4 are mixed with ions having energy different from the desired energy.

It is not desirable in a case of utilizing charged particles such as ions that the energy contamination described above occurs. For example, in the ion implanting apparatus, it is not desirable that ions having desired energy and ions having energy different from the desired energy or neutral particles are implanted into the target 14. This is because the ions having different energies change implantation depth and implantation distribution from those at an initial stage and thus degrade ion.

Then, in order to suppress the energy contamination, in a conventional technique, like the example shown in FIG. 5, an energy separating unit 12 for selecting and passing ions having specific energy (that is, having an energy separating function) is disposed on the downstream side of the electrostatic acceleration column 10 and only ions having the desired energy are selected by this energy separating unit 12. To be specific, this energy separating unit 12 is a deflecting magnet or an electrostatic deflecting unit.

When the energy separating unit 12 described above is disposed, however, it increases the transport distance of the ions 4 by the amount relating thereto and thus decreases the transport efficiency of the ions 4. This is because when the transport distance increases, divergence of the ions 4 in the transport caused by space charges increases, which results in increasing loss of the ions 4. The same holds true for a case where charged particles other than ions are transported.

SUMMARY OF THE INVENTION

It is an object of the present invention to provide an electrostatic accelerator (Hereinafter, referred to as "electrostatic acceleration column") capable of suppressing energy contamination and shortening transport distance of charged particles.

It is a further object of the present invention to provide an electrostatic acceleration column using for ion implanting apparatus and being capable of suppressing energy contamination and shortening transport distance of charged particles.

An electrostatic acceleration column in accordance with the present invention is characterized in that in an electrostatic acceleration column of the type which has a plurality of electrodes arranged in the direction of travel of charged particles and accelerates or decelerates the charged particles, at least one electrode of the plurality of electrodes is divided into two electrode members which are opposed to each other across the path of the charged particles and to which different electric potentials are applied thereby to deflect the charged particles.

According to the electrostatic acceleration column described above, it is possible to deflect the charged particles by the electrode divided into the two electrode members. The amount of deflection at this time depends on the energy of the charged particles at a time when they are deflected, so that it is possible to separate the charged particles having desired energy from the charged particles having energy different from the desired energy. Neutral particles are not deflected but travel in straight lines, so that it is possible to separate also the neutral particles. That is, the above-mentioned electrostatic acceleration column produces an energy separating action and thus can select and emit the charged particles having desired energy and can suppress energy contamination.

Further, the electrostatic acceleration column produces the energy separating action and its intrinsic action of accelerating or decelerating the charged particles and further can realize these actions by one electrostatic acceleration column, so that it is possible to eliminate the need of providing an energy separating unit used in the conventional apparatus. Therefore, it is possible to shorten the transport distance of the charged particles and thus to improve the transport efficiency of the charged particles, as compared with the case where the energy separating unit is separately provided.

In a case where an electrode is arranged also on a downstream side from the above-mentioned electrode divided into the two electrode members, it is preferable that the electrode arranged on the downstream side is arranged along the orbit of the charged particles deflected and having specific energy. This makes it possible to pass the charged particles having specific energy, to be more specific, the desired energy with efficiency and to block the charged particles other than the charged particles having the desired energy and neutral particles by the electrode arranged on the downstream side with efficiency and thus to effectively suppress the energy contamination.

In a case where there are provided a first electrode, a second electrode, and a third electrode arranged in the direction of travel of the charged particles, it is preferable that the second electrode arranged at the middle is divided into two electrode members, as described above, and the third electrode arranged on the downstream side thereof is arranged a long the orbit of the charged particles deflected and having specific energy. This makes it possible to accelerate the charged particles at two steps between the first and the second electrodes and between the second and the third electrodes and to deflect the charged particles before accelerating them at the latter step and thus to easily deflect the charged particles. Further, since the third electrode is provided, it can effectively suppress the energy contamination because of the reason described above.

In a case where the charged particles described above are positive ions, an electric potential applied to the electrode member in the direction of deflecting the positive ions, of the electrode divided into the two electrode members, is set lower than an electric potential applied to the electrode member opposed thereto. In a case where the charged particles described above are negative ions, an electric potential applied to the electrode member is opposite to this potential.

By the use of the electrostatic acceleration column described above, an ion implanting apparatus for implanting ions through the electrostatic acceleration column into a target may be constructed. This makes it possible to suppress the energy contamination by the electrostatic acceleration column, as described above, and thus to suppress the deterioration of ion implantation characteristics caused by the energy contamination. Further, it is possible to shorten the transport distance of the ions by the use of the electrostatic acceleration column and thus to improve the transport efficiency of the ions and to improve the throughput of implantation of the ions into the target.

DESCRIPTION OF THE PREFERRED EMBODIMENTS

Figure 1:
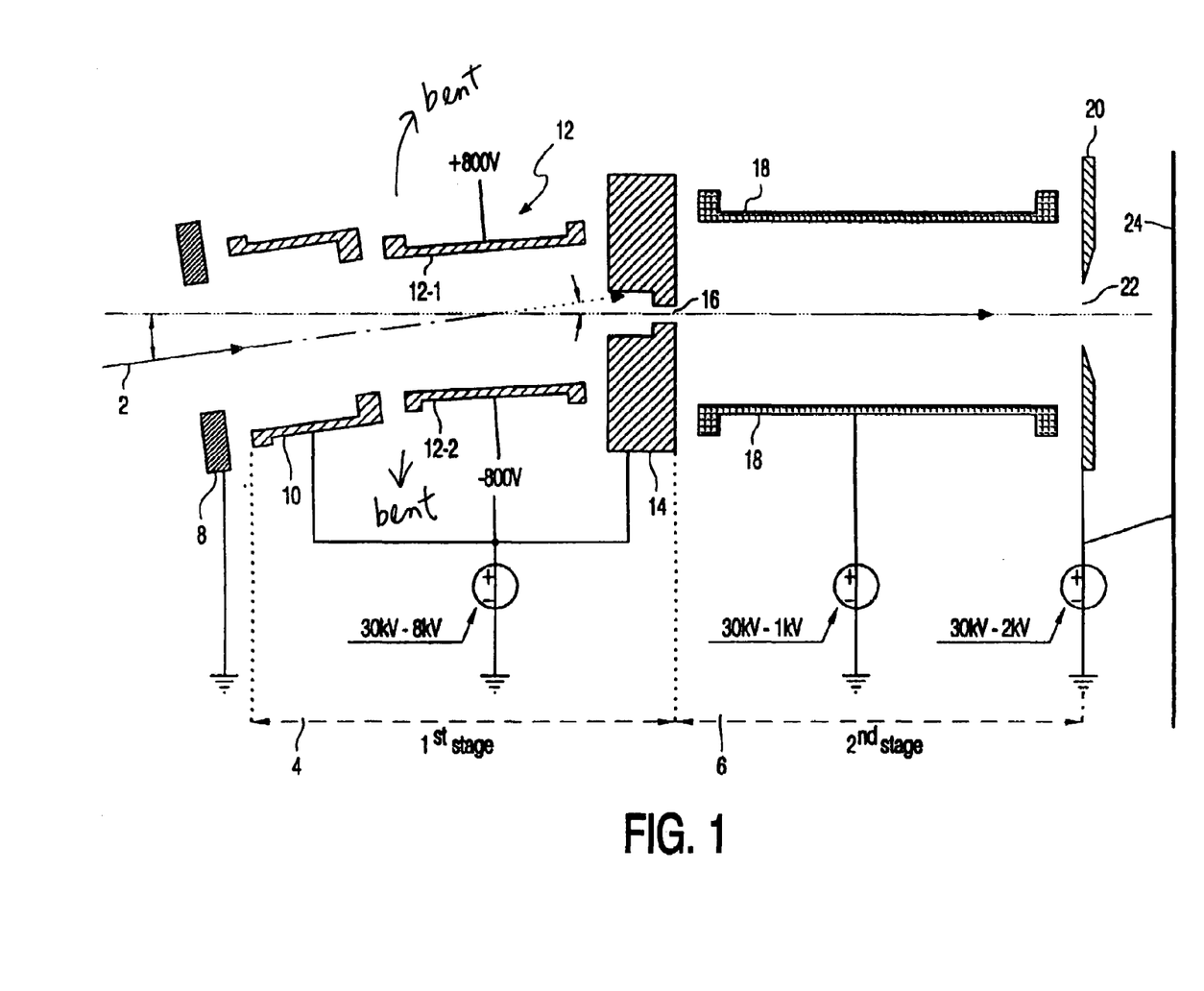
FIG. 1 is a transverse cross-sectional view showing one example of an electrostatic acceleration column in accordance with the present invention.

FIG. 1 is a transverse cross-sectional view showing one example of an electrostatic accelerator (Hereinafter, referred to as "electrostatic acceleration column") in accordance with the present invention.

Figure 2:
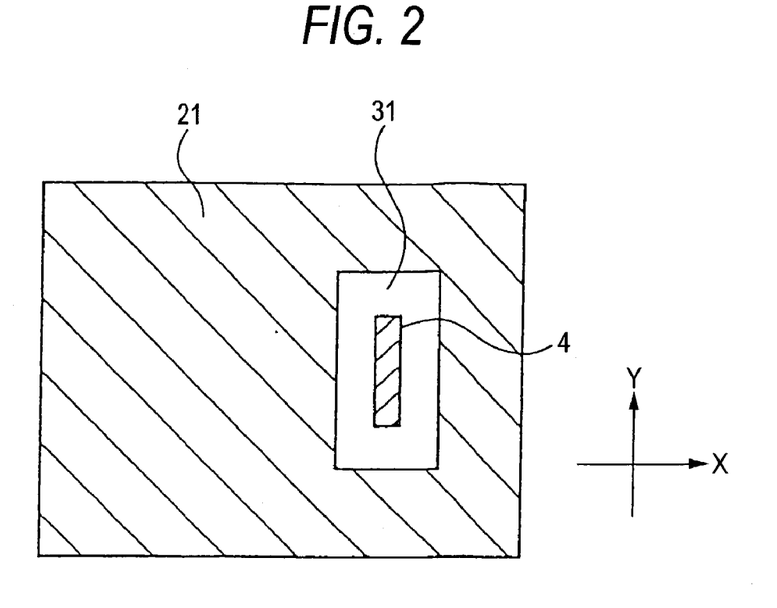
FIG. 2 is a longitudinal cross-sectional view along a line A—A in FIG. 1.
Figure 3:
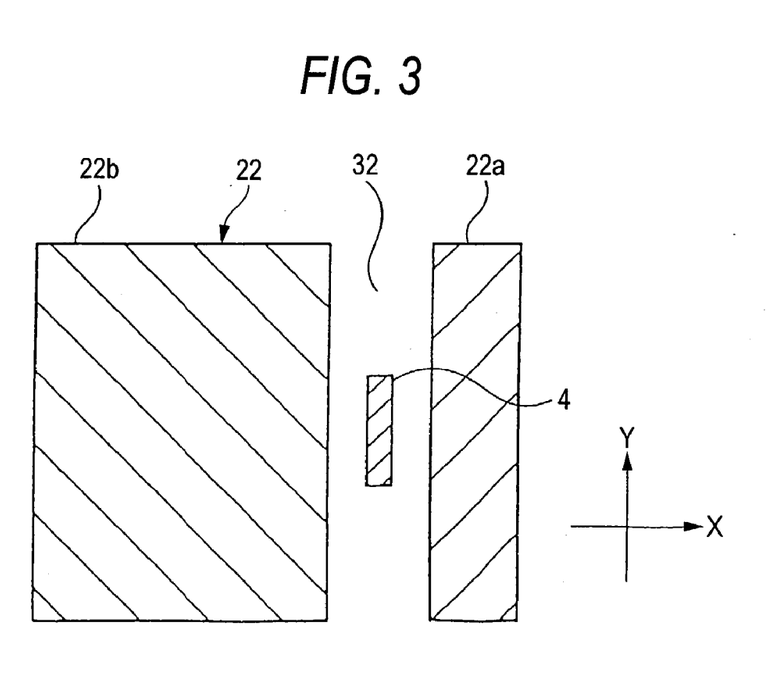
FIG. 3 is a longitudinal cross-sectional view along a line B—B in FIG. 1.

However, as for ions 4, for the sake of simplification, only a central orbit is illustrated by a line. FIG. 2 is a longitudinal cross-sectional view along a line A—A in FIG. 1. FIG. 3 is a longitudinal cross-sectional view along a line B—B in FIG. 1.

An electrostatic acceleration column 20 accelerates (in an accelerating mode) or decelerates (in a decelerating mode) ions 4. The ions 4 are a kind of charged particles.

The electrostatic acceleration column 20 has first to fifth electrodes 21 to 25 arranged in the direction of travel of the ions 4. These electrodes 21 to 25 are arranged in increasing order of number from an upstream side to a downstream side.

The ions 4 form an ion beam emitted from, for example, the above-mentioned mass separating magnet 6.

In this embodiment, as shown in FIG. 2 and FIG. 3, these ions 4 form an ion beam longitudinally elongated in cross section, which is elongated in the longitudinal direction of Y crossing the direction of travel of the ions 4. It is not intended to limit shape of ion beams 4. For example, the ions 4 may form an ion beam shaped like a spot or scanned ion beam in a specific direction (for example, in the longitudinal direction of Y).

The respective electrodes 21, 23 to 25 have a shape nearly corresponding to the shape of beam of the ions 4 described above and openings 31, 33 to 35 through which the ions 4 pass, respectively. The electrode 22, in this embodiment, has a gap 32 through which the above-mentioned ions 4 pass.

An electric potential V1 is applied to the first electrode 21. This electric potential V1 is usually a positive high electric potential (in the accelerating mode) or a negative high electric potential (in the decelerating mode). Thus is called also a high electric potential electrode.

Incidentally, when electric potentials are applied to the respective electrodes 21 to 25 or the electrode members 22a, 22b, Which will be later described, the electric potentials are applied to the electrodes by electric voltage applying means corresponding to the respective electrodes (for example, a DC power source or a voltage dividing resister for dividing electric voltage from a DC power source, or the like, the illustration of which will be omitted.

In a case where the electric potential is 0 volt for an electrode, the electrode is grounded.

The second electrode 22 is usually brought to an intermediate electric potential between the first electrode 21 and the third electrode 23. The second electrode 22 is positioned between both the electrodes 21 and 23. Therefore, it is also called an intermediate electrode.

This second electrode 22 is one electrode in the conventional electrostatic acceleration column, but in this embodiment, is formed by two divided electrode members 22a and 22b opposed to each other across the path of the ions 4 in a lateral direction of X.

Further, electric potentials V2a and V2b (V2a≠V2b) are applied to both the electrode members 22a and 22b to deflect the ions 4 in the lateral direction of X.

Means for applying such an electric potential has been described above.

To be more specific, in this embodiment, as described above, the ions 4 (which are positive ions, as described above, except where specifically noted) are used as a kind of charged particles.

The electric potential V2b is lower than the electric potential V2a applied to the electrode member 22a.

The electric potential V2b is applied to the electrode member 22b in the direction, to which the ions 4 are to be deflected, that is to say, V2b<V2a.

The specific electric potentials applied to the electrode 21, the electrode members 22a, 22b, and the electrodes 23 to 25 will be shown together in a table 1 described below.

A gap 32 through which the ions 4 travels is formed between two electrode members 22a and 22b included in the electrode 22.

It is preferable that, like this embodiment (see FIG. 1), this gap 32 be bent in the direction of deflection of the ions 4.

To be more specific, it is preferable that this gap be bent along the orbit of the ions 4a deflected with specific energy, specifically, desired energy.

In this manner, the ions 4a having desired energy can be emitted with efficiency.

An electric potential V3 of 0 volt is usually applied to the third electrode 23. That is, the third electrode 23 is grounded and thus is also called a ground electrode.

A negative electric potential V4 is applied to the fourth electrode 24 to suppress a backflow of electrons from the downstream side. Thus, the fourth electrode 24 is also called a suppressor electrode.

An electric potential V5 of 0 volt is usually applied to the fifth electrode 25. That is, the fifth electrode 25 is grounded and thus is also called a ground electrode.

Although it is preferable that the above-mentioned electrodes 24 and 25 be provided to suppress the backflow of electrons from the downstream side, they are not essential. They need not always be provided.

The electrodes 23 to 25 are arranged on the downstream side from the second electrode 22 including the two divided electrode members 22a, 22b.

The electrodes 23 to 25 are preferably arranged along the orbit of the ions 4a deflected by the electrode 22 and having specific energy, specifically, desired energy.

It is preferable that a rear parts of two electrode members 22a and 22b are formed to be bent in such manner that two electrode members 22a, 22b are positioned along the orbit of the ions 4a having a desired energy. Thus, even though difference in electric potential between the electrode members 22a and 22b is small, bending angle of the ions 4a may be large so that ions except for the ions 4a having desired energy are removed more easily.

This makes it possible to introduce the ions 4a having desired energy with efficiency and to block ions 4b, 4c other than the ions 4a or neutral particles 5 by the electrodes 23 to 25 arranged on the downstream side with efficiency. Thus energy contamination is suppressed more effectively.

A difference between the electric potentials V2a and V2b applied to the electrode members 22a and 22b may be adjusted in such a way that the ions 4a having desired (objective) energy pass through the central orbit of the electrostatic acceleration column 20. To be specific, the central orbit (to be more specific, inside the gap 32 or the openings 33 to 35 of the electrodes 22 to 25) of the electrostatic acceleration column is corresponding to the central orbit of the electrodes 22 to 25 arranged downstream from the second electrode 22 having the deflecting function.

In a case where the ions 4 are positive ions, examples of electric potentials applied to the respective electrodes and electrode members described above will be shown together in Table 1.

An example 1 and an example 2 in Table 1 shows data in the acceleration mode for accelerating the ions 4 and an example 3 shows data in the deceleration mode for decelerating the ions 4.

In a case of the example 1, an accelerating energy of 30 keV can be realized and in a case of the example 2, an accelerating energy of 130 keV can be realized. In a case of the example 3, a decelerating energy of 8 keV can be realized.

In any cases, the electric potential V2b of the electrode member 22b which is one of the electrode members included in the second electrode 22 is set lower than the electric potential V2a of the opposite electrode member 22a.

TABLE 1

|  | Electric Potential V1 [keV] | Electric Potential V2a [keV] | Electric Potential V2b [keV] | Electric Potential V3 [keV] | Electric Potential V4 [keV] | Electric Potential V5 [keV] |
| --- | --- | --- | --- | --- | --- | --- |
| Example 1 | 30 | 0 | −48 | 0 | −5 | 0 |
| Example 2 | 130 | 100 | 52 | 0 | −5 | 0 |
| Example 3 | −8 | 0 | −1 | 0 | 0 | 0 |

According to the above-mentioned electrostatic acceleration column 20, the second electrode 22 includes the two divided electrode members 22a and 22b, to which different electric potentials V2a and V2b are applied. The second electrode may deflect the ions 4.

The amount of deflection at this time depends on the energy of the ions 4 when they are deflected, so that the ions 4a having desired energy can be separated from the ions 4b and 4c having energy different form the desired energy.

The ions 4b are ions having lower energy than the desired energy and are larger in the amount of deflection than the ions 4a. The ions 4c are ions having higher energy than the desired energy and are smaller in the amount of deflection than the ions 4a. The neutral particles 5 are not deflected but travel in straight lines and thus can be also separated from the ions 4a. That is, the above-mentioned electrostatic acceleration column 20 produces an energy separating action and thus can select and introduce the ions 4a having the desired energy and suppress the energy contamination.

The ions 4b and 4c other than the ions 4a having the desired energy and the neutral particles 5 collide with any one of the electrodes 23 to 25 arranged on the downstream side from the second electrode 22, thereby being blocked and removed.

Further, this electrostatic acceleration column 20 produces not only the above-mentioned energy separating action but also an intrinsic action of accelerating or decelerating the ions 4. Still further, these actions can be realized in one electrostatic acceleration column 20, which eliminates the need of providing a separate energy separating unit used in the conventional apparatus. Thus, the electrostatic acceleration column 20 can shorten a transport distance of the ions 4 as compared with the case where the energy separating unit is separately provided and thus can improve the transport efficiency of the ions 4.

Moreover, like the example shown in FIG. 1, in a case where the second electrode 22 which is usually brought to an intermediate electric potential between the electrode 21 and 23 is positioned between the first electrode 21 which is brought to a positive or negative high electric potential and the third electrode 23 which is usually brought to the ground potential, like the example described above, it is preferable that this second electrode 22 be constructed of the two divided electrode members 22a and 22b and that the different electric potentials V2a and V2b be applied to the electrode members 22a and 22b to produce the deflecting function.

When the second electrode 22 like this is provided, the ions 4 can be accelerated at two steps between the electrodes 21 and 22 and between the electrodes 22 and 23. The example 2 in Table 1 shows such an example. Then, the ions 4 can be accelerated by the electrode 22 before they are accelerated at the latter step (that is, when energy is low) and thus the ions 4 can be easily deflected as compared with a case where the ions 4 are deflected after they are fully accelerated. To be more specific, the second electrode 22 like this can reduce the difference between the electric potentials V2a and V2b applied to the two electrode members 22a and 22b constructing the electrode 22 and thus can produce an advantage of facilitating electric insulation around the electrode 22.

Further, the electrode 23 on the downstream side of the electrode 22 can block and remove the ions other than the ions 4a having the desired energy and the neutral particles and thus can more effectively suppress the energy contamination. Experience shows that, particularly, in the decelerating mode (see the example 3 in Table 1), the neutral particles 5 tends to be generated by the charge conversion when the ions 4 are decelerated between the electrodes 21 and 22, but even if the neutral particles 5 are generated in large amounts, they travel in straight lines and collide with the electrode 23, thereby being blocked. Thus, the neutral particles 25 can be effectively removed in the electrostatic acceleration column 20.

Still further, in the accelerating mode, electrons are emitted and accelerated to the high electric potential side from the positions where ions having energy different from the desired energy collide with the electrode. Thus, an X ray having high energy corresponding to the energy of the accelerated electrons is generated from the portion of the electrode where the accelerated electrons like this collide.

In the conventional electrostatic acceleration column, even if there is provided an electrode called an intermediate electrode, the intermediate electrode of the conventional one does not have a deflecting function.

Thus, the above-mentioned accelerated electrons are not bent by the intermediate electrode but can reach an electrode having a high electric potential (electrode corresponding to the electrode 21). The electrons are accelerated by energy corresponding to the electric potential of the electrode has the high electric potential, and then collide with the electrode having the high electric potential to generate an X ray having large energy from the electrode.

In contrast, when the second electrode 22 called the intermediate electrode is divided into the two electrode members 22a and 22b and different electric potentials, which are applied to have the deflecting function, like the example described above, the electrons produced from the portions which the ions having undesired energy collide with are bent by the electrode 22. Thus the electrons may not reach the electrode 21 having a high electric potential.

To be more specific, the above-mentioned electrons are bent to the side of electrode member 22a having the higher electric potential of the two electrode members 22a and 22b constructing the electrode 22 thereby to collide with the electrode 22a.

The energy at this time of accelerating the electrons is energy corresponding to the electric potential of the electrode 22a and is smaller than the energy in a case where the electrons collide with the electrode 21 having the high electric potential.

For example, in a case of the example 1 in Table 1, the energy of the colliding electron is nearly 0 eV and thus an X ray are hardly generated. In a case of the example 2, the energy of the colliding electron is nearly 100 keV and is smaller than 130 keV in a case where the electron collides with the electrode 21.

Thus, in either case, the energy of the X ray generated from this electrostatic acceleration column can be reduced, as compared with the conventional electrostatic acceleration column.

When two divided electrode members 22a and 22b are formed to be bent in such manner that two electrode members 22a, 22b are positioned along the orbit of the ions 4a having a desired energy, the energy of the X ray generated from this electrostatic acceleration column can be reduced more effectively.

In the electrostatic acceleration column 20 having the construction shown in FIG. 1, a simulation was performed as to the orbit of ions in a case where a $BF_2^+$ ion beam having an energy of 70 keV was used as incoming ions 4 and was accelerated by 30 keV by the electrostatic acceleration column 20 to produce ions 4 having a desired energy of 100 keV. The electric potentials of the respective electrodes and electrode members were set at the data in the example 1 in Table 1. The deflection angle of the ions 4a at this time was about 30 degrees.

As a result, it was verified that $BF^+$ ions dissociated from the $BF_2^+$ ions having an energy of 70 keV near the electrode 21 (the energy of this ion was about 43 keV from a ratio of mass number of $BF^+$ to $BF_2^+$) were accelerated by 30 keV between the electrodes 21 and 23 to have a final energy of about 73 keV and were deflected by the electrode 22 constructed of the two divided electrode members 22a and 22b thereby to be put on the orbit shown by the ions 4b in FIG. 1, whereby they collided with the electrode 25 and were removed.

In this respect, while it is preferable that the electrode constructed of the two divided electrode members to which different electric potentials are applied be the second electrode (intermediate electrode) 22, as described above, the electrode is not limited to the second electrode but may be the other electrode constructing the electrostatic acceleration column 20. Moreover, it is also recommended that a plurality of electrodes be constructed in this manner. In shorts, it is recommended that at least one electrode be constructed in this manner. When a plurality of electrodes is constructed in this manner, they can deflect the ions 4 a plurality of times to perform energy separation the plurality of times and thus can further effectively suppress the energy contamination.

For example, instead of dividing the second electrode in the manner described above, or in addition to this, it is also recommended that the first electrode 21 be constructed of two divided electrode members and that different electric potentials be applied to them to deflect the ions 4, or it is also recommended that the third electrode 23 be constructed of two divided electrode members and that different electric potentials be applied to them to deflect the ions 4. It is preferable that deflected ions 4 are deflected more than 15 degree. It is preferable that two divided electrodes 22 and 23 are formed to be bent in such manner that two electrode members 21, 23 are positioned along the orbit of the ions 4a having a desired energy.

The electrostatic acceleration column 20 described above can be applied also in a case where negative ions, of the other example of charged particles, are accelerated, that is, in a case where the ions 4 are negative ions. In this case, the electric potential applied to the electrode member in the direction which deflects the negative ions, of the electrode constructed of the two divided electrode members, is set higher than the electric potential applied to the opposite electrode member. For example, in the example shown in FIG. 1, $V2b>V2a$. The other conditions are the same as is the case in the positive ions.

The electrostatic acceleration column 20 described above is suitably used, for example, for an ion implanting apparatus. One example of the ion implanting apparatus provided with the electrostatic acceleration column 20 described above will be shown in FIG. 4. Here, the same parts as in the conventional apparatus shown in FIG. 5 are denoted by the same reference characters and their overlapping description will be omitted.

Figure 4:
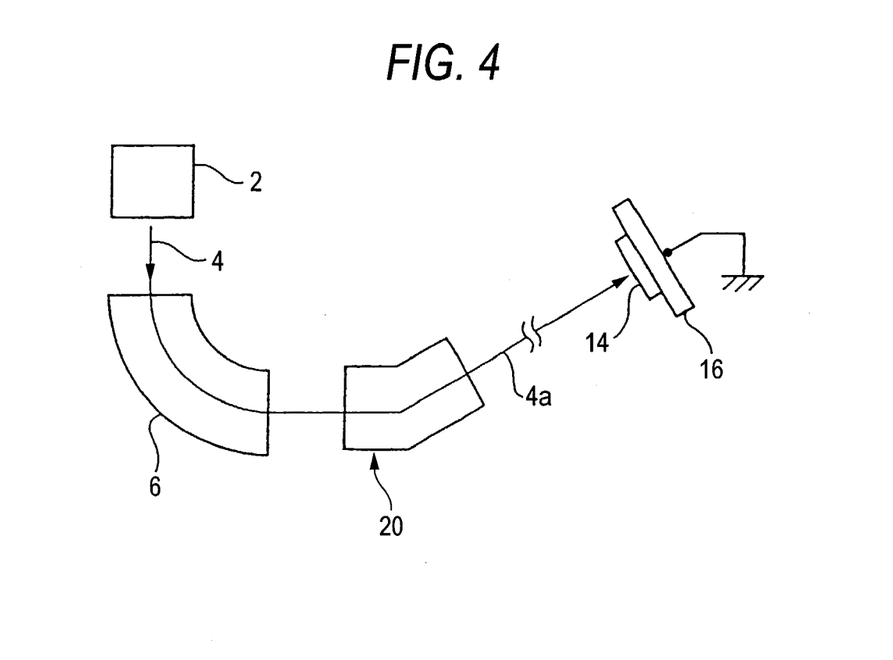
FIG. 4 is a schematic view showing one example of an ion implanting apparatus provided with an electrostatic acceleration column in accordance with the present invention.

This ion implanting apparatus is so constructed as to accelerate or decelerate the ions (positive ions) 4 emitted from the mass separating magnet 6 described above through the electrostatic acceleration column 20 to implant the ions 4 emitted from the electrostatic acceleration column 20 (to be more specific, the ions 4 having the desired energy) into the target 14 thereby to perform ion implantation. Negative ions, in place of the positive ions, may be used as the ions 4.

According to this ion implanting apparatus, the energy contamination can be suppressed by the electrostatic acceleration column 20, as described above, so that in a case of implanting the ions in to the target 14, it is possible to suppress the deterioration of ion implantation characteristics caused by the energy contamination. Further, the use of the electrostatic acceleration column 20 eliminates the need of providing the energy separating unit used in the conventional apparatus and thus can shorten the transport distance of the ions 4. As a results, this improves the transport efficiency of the ions 4 and thus improves the throughput of implantation of the ions 4 into the target 14.

This invention is constructed in the manner described above and thus can produce the following effects.

According to the invention, it is possible to deflect the charged particles by the electrode portion constructed of the two divided electrode members and thus to produce an energy separating action. Therefore, it is possible to select and pass the charged particles having the desired energy and to suppress the energy contamination. Further, in addition to the energy separating action, it is possible to produce also the intrinsic action of accelerating or decelerating the charged particles and to realize these actions in one electrostatic acceleration column, which eliminates the need of separately providing the energy separating unit used in the conventional apparatus. Therefore, it is possible to shorten the transport distance of the charged particles as compared with the case where the energy separating unit is separately provided and thus to improve the transport efficiency of the charged particles.

According to the invention, it is possible to pass the charged particles having specific energy with efficiency and to block with efficiency the charged particles other than these and the neutral particles by the electrode on the downstream side. Thus, it is possible to further produce an effect of efficiently suppressing the energy contamination.

According to the invention, in addition to the same effects produced by the invention as claimed in claim 1, it is possible to further produce the following effects. That is, it is possible to accelerate the charged particles at two steps and to deflect the charged particles before accelerating the charged particles at the latter step and thus to easily deflect the charged particles. Further, since the third electrode is provided, it can further effectively suppress the energy contamination because of the same reason of the invention as claimed in claim 2. Still further, it is possible to bend the electrons generated by the collision of the undesired charged particles by the second electrode and to prevent the electrons from reaching the first electrode. Thus, it is possible to reduce the energy of the X ray generated by the collision of the electrons.

According to the invention, large deflection angle may be obtained more easily so that energy contamination may be suppressed more effectively.

According to the invention, as for the positive ions, it is possible to produce the effects produced by the invention as stated above.

According to the invention, it is possible to suppress the energy contamination by the above-mentioned electrostatic acceleration column, as described above, and thus to suppress the deterioration of the ion implantation characteristics caused by the energy contamination. Further, the use of the electrostatic acceleration column eliminates the need for providing the energy separating unit used in the conventional apparatus and thus can shorten the transport distance of the ions. As a result, it is possible to improve the transport efficiency of the ions and thus to improve the throughput of implantation of the ions into the target.

What is claimed is:

1. An electrostatic accelerator, comprising:
    an electrostatic acceleration column having a plurality of electrodes arranged in a traveling direction of charged particles;
    wherein at least one of the electrodes is divided into two separate electrode members, which are opposed to each other across a path of the charged particles,
    wherein different electric potentials are applied to said two electrode members so that said charged particles are deflected,
    wherein a rear part of two separate electrode members is formed to be bent in such a manner that two separate electrode members are positioned along an orbit of ions having a predetermined energy, and
    wherein the electrostatic acceleration column accelerates the charged particles, while in an accelerating mode, and decelerates the charged particles, while in a decelerating mode.

2. The electrostatic accelerator according to claim 1, wherein at least one of the plurality of electrodes are arranged on a downstream side of said at least one of the electrodes divided into two electrodes members, and wherein said at least one of the plurality of electrodes is arranged along an orbit of said deflected charged particles having desired energy.

3. An electrostatic accelerator, comprising:
    an electrostatic acceleration column having a plurality of electrodes arranged in a traveling direction of said charged particles, said plurality of electrodes including three electrodes in order of the first electrode, the second electrode, and the third electrode from an upstream side;
    wherein said second electrode is divided into two separate electrode members, which are opposed to each other across a path of said charged particles,
    wherein different electric potentials are applied to said two electrode members so that said charged particles are deflected;
    wherein said third electrode is arranged along an orbit of said deflected charged particles having desired energy;
    wherein a rear part of two separate electrode members is formed to be bent in such a manner that two separate electrode members are positioned along an orbit of ions having a predetermined energy; and
    wherein the electrostatic acceleration column accelerates the charged particles, while in an accelerating mode, and decelerates the charged particles, while in a decelerating mode.

4. The electrostatic accelerator according to claim 3, wherein shapes of said electrode members are formed in accordance with the orbit of said deflected charged particles having desired energy.

5. The electrostatic accelerator according to claim 3, wherein said charged particles are deflected more than 15 degrees from the beam line toward the x axis direction.

6. The electrostatic accelerator according to claim 1, wherein an electric potential applied to one of said electrode members, which deflects positive charged particles, is lower an electric potential applied to the other of said electrode members.

7. The electrostatic accelerator according to claim 3, wherein an electric potential applied to one of said electrode members, which deflects positive charged particles, is lower an electric potential applied to the other of said electrode members.

8. An ion implanting apparatus for implanting ions into a substrate, comprising:
    an electrostatic accelerator including an electrostatic acceleration column having a plurality of electrodes arranged in a traveling direction of charged particles,
    wherein at least one of the electrodes is divided into two separate electrode members, which are opposed to each other across a path of the charged particles;
    wherein different electric potentials are applied to said two electrode members so that said charged particles are deflected;
    wherein a rear part of two separate electrode members is formed to be bent in such a manner that two separate electrode members are positioned along an orbit of ions having a predetermined energy; and
    wherein the electrostatic acceleration column accelerates the charged particles, while in an accelerating mode, and decelerates the charged particles, while in a decelerating mode.

9. An ion implanting apparatus for implanting ions into a substrate, comprising:
    an electrostatic accelerator including an electrostatic acceleration column having a plurality of electrodes arranged in a traveling direction of said charged particles, said plurality of electrodes including three electrodes in order of the first electrode, the second electrode, and the third electrode from an upstream side;
    wherein said second electrode is divided into two separate electrode members, which are opposed to each other across a path of said charged particles;
    wherein different electric potentials are applied to said two electrode members so that said charged particles are deflected;
    wherein said third electrode is arranged along an orbit of said deflected charged particles having desired energy;
    wherein a rear part of two separate electrode members is formed to be bent in such a manner that two separate electrode members are positioned along an orbit of ions having a predetermined energy; and
    wherein the electrostatic acceleration column accelerates the charged particles, while in an accelerating mode, and decelerates the charged particles, while in a decelerating mode.

10. An electrostatic accelerator, comprising:
    an electrostatic acceleration column having a plurality of electrodes arranged in a traveling direction of charged particles wherein at least one of the electrodes is divided into two electrode members that are opposed to each other across a path of the charged particles,
    wherein different electric potentials are applied to the two electrode members so that the charged particles are deflected,
    wherein an electrode disposed in front of the two electrode members has a different electric potential from an electrode disposed behind the two electrode members, and
    wherein the electrostatic acceleration column accelerates the charged particles, while in an accelerating mode, and decelerates the charged particles, while in a decelerating mode.

11. An electric accelerator, comprising:
    an electrostatic acceleration column having a plurality of electrodes arranged in a traveling direction of charged particles wherein at least one of the electrodes is divided into two electrode members that are opposed to each other across a path of the charged particles;

wherein a first electrode is disposed in front of the two electrode members;

wherein a second electrode is disposed behind the two electrode members, wherein the first and second electrodes are disposed along the traveling direction of the charged particles, wherein different electric potentials are applied to the two electrode members so that the charged particles are deflected, and wherein the electrostatic acceleration column accelerates the charged particles, while in an accelerating mode, and decelerates the charged particles, while in a decelerating mode.

* * * * *

UNITED STATES PATENT AND TRADEMARK OFFICE
CERTIFICATE OF CORRECTION

| | | |
|---|---|---|
| PATENT NO. | : 7,098,614 B2 | |
| APPLICATION NO. | : 10/357398 | |
| DATED | : August 29, 2006 | |
| INVENTOR(S) | : Takatoshi Yamashita | |

It is certified that error appears in the above-identified patent and that said Letters Patent is hereby corrected as shown below:

Delete the title page and substitute therefor the attached title page.

Delete Drawing Sheet 1 of 3 and substitute therefor the attached Drawing Sheet 1 of 3.

Signed and Sealed this

Fifteenth Day of May, 2007

JON W. DUDAS
*Director of the United States Patent and Trademark Office*

(12) United States Patent
Yamashita (10) Patent No.: US 7,098,614 B2
(45) Date of Patent: Aug. 29, 2006

(54) ELECTROSTATIC ACCELERATOR AND ION IMPLANTING APPARATUS WITH THE SAME

(75) Inventor: Takatoshi Yamashita, Kyoto (JP)

(73) Assignee: Nissin Ion Equipment Co., Ltd., Kyoto (JP)

(*) Notice: Subject to any disclaimer, the term of this patent is extended or adjusted under 35 U.S.C. 154(b) by 0 days.

(21) Appl. No.: 10/357,398

(22) Filed: Feb. 4, 2003

(65) Prior Publication Data
US 2003/0173914 A1 Sep. 18, 2003

(30) Foreign Application Priority Data
Feb. 6, 2002 (JP) .............. 2002-029392

(51) Int. Cl.
H01J 23/00 (2006.01)
(52) U.S. Cl. .............. 315/500; 250/492.21
(58) Field of Classification Search ........ 315/500–507, 315/5.31, 5.32, 5.37, 5.38, 5.39, 5.4, 111.01–111.91, 315/396 R; 250/398, 423 R, 492.2, 492.21, 250/396 R, 394, 492.3, 413 R
See application file for complete search history.

(56) References Cited

U.S. PATENT DOCUMENTS

| | | | |
|---|---|---|---|
| 4,383,180 A | 5/1983 | Turner | 315/500 |
| 4,556,794 A | 12/1985 | Ward et al. | 250/309 |
| 5,187,371 A * | 2/1993 | Matsui et al. | 250/396 R |
| 6,326,631 B1 * | 12/2001 | Politiek et al. | 250/492.21 |
| 6,525,326 B1 * | 2/2003 | Harrington et al. | 250/492.21 |
| 6,734,446 B1 * | 5/2004 | Yamazaki et al. | 250/492.21 |

FOREIGN PATENT DOCUMENTS

| | | |
|---|---|---|
| JP | 60207237 | 10/1985 |
| JP | 63119199 | 5/1988 |
| JP | 05-47344 | 2/1993 |
| JP | 6-68836 | 3/1994 |
| JP | 08-35100 | 2/1996 |
| JP | 09-45273 | 2/1997 |
| WO | WO 02/052609 A2 | 7/2002 |

OTHER PUBLICATIONS

Hideo Kawahara, Japanese Office Action Mailing Date Aug. 31, 2004, and English translation.

* cited by examiner

*Primary Examiner*—Wilson Lee
(74) *Attorney, Agent, or Firm*—Finnegan, Henderson, Farabow, Garrett & Dunner LLP (57) ABSTRACT

This electrostatic acceleration column has first to fifth electrodes arranged in a traveling direction of ions, which are a kind of charged particles. Then, the second electrode divided into two electrode members, which are opposed to each other across a path of the ions, and to which different electric potentials are applied to deflect the ions. Further, the electrodes arranged on a downstream side from the electrode are arranged along an orbit of ions deflected by the electrode and having specific energy.

11 Claims, 3 Drawing Sheets

FIG. 1